(12) United States Patent
Ranjan et al.

(10) Patent No.: US 8,183,652 B2
(45) Date of Patent: May 22, 2012

(54) NON-VOLATILE MAGNETIC MEMORY WITH LOW SWITCHING CURRENT AND HIGH THERMAL STABILITY

(75) Inventors: Rajiv Yadav Ranjan, San Jose, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 24 days.

(21) Appl. No.: 11/739,648

(22) Filed: Apr. 24, 2007

(65) Prior Publication Data

US 2008/0191251 A1  Aug. 14, 2008

Related U.S. Application Data

(63) Continuation-in-part of application No. 11/674,124, filed on Feb. 12, 2007, and a continuation-in-part of application No. 11/678,515, filed on Feb. 23, 2007.

(51) Int. Cl.
*H01L 29/82* (2006.01)
*G11C 11/00* (2006.01)

(52) U.S. Cl. .................. 257/421; 257/E21.665; 365/158

(58) Field of Classification Search .................. 257/421, 257/427, E21.665; 365/158, 171
See application file for complete search history.

(56) References Cited

U.S. PATENT DOCUMENTS

| | | | |
|---|---|---|---|
| 3,665,264 A | 5/1972 | Yukami et al. |
| 5,060,098 A | 10/1991 | Gotoh et al. |
| 5,695,864 A | 12/1997 | Slonczewski |
| 6,072,718 A | 6/2000 | Abraham et al. |
| 6,169,689 B1 | 1/2001 | Naji |
| 6,285,581 B1 | 9/2001 | Tehrani et al. |
| 6,365,419 B1 | 4/2002 | Durlam et al. |
| 6,421,270 B1 | 7/2002 | Tai |
| 6,469,926 B1 | 10/2002 | Chen |
| 6,501,139 B1 | 12/2002 | Petti |
| 6,590,806 B1 | 7/2003 | Bhattacharyya |
| 6,603,677 B2 | 8/2003 | Redon et al. |

(Continued)

FOREIGN PATENT DOCUMENTS

JP  2006295198  10/2006

(Continued)

OTHER PUBLICATIONS

T. Sek et al.; Spin-polarized current-induced magnetization reversal in perpendicularly magnetized L10-FePt layers; Applied Physics Letters; 88, 172504 2006 ; Apr. 25, 2006.

(Continued)

*Primary Examiner* — Anh Phung
*Assistant Examiner* — Allison P Bernstein
(74) *Attorney, Agent, or Firm* — Maryam Imam; Iplaw Group LLP

(57) ABSTRACT

A non-volatile current-switching magnetic memory element includes a bottom electrode, a pinning layer formed on top of the bottom electrode, and a fixed layer formed on top of the pinning layer. The memory element further includes a tunnel layer formed on top of the pinning layer, a first free layer formed on top of the tunnel layer, a granular film layer formed on top of the first free layer, a second free layer formed on top of the granular film layer, a cap layer formed on top of the second free layer, and a top electrode formed on top of the cap layer.

18 Claims, 8 Drawing Sheets

U.S. PATENT DOCUMENTS

| | | | |
|---|---|---|---|
| 6,639,312 B2 | 10/2003 | Herner et al. | |
| 6,642,595 B1 | 11/2003 | Hung et al. | |
| 6,649,451 B1 | 11/2003 | Vyvoda et al. | |
| 6,670,660 B2 | 12/2003 | Hosotani | |
| 6,697,294 B1 | 2/2004 | Qi et al. | |
| 6,714,444 B2 | 3/2004 | Huai et al. | |
| 6,724,585 B2 | 4/2004 | Hayashi | |
| 6,743,642 B2 | 6/2004 | Costrini et al. | |
| 6,744,086 B2 | 6/2004 | Daughton et al. | |
| 6,759,263 B2 | 7/2004 | Ying et al. | |
| 6,783,999 B1 | 8/2004 | Lee | |
| 6,821,907 B2 | 11/2004 | Hwang et al. | |
| 6,893,893 B2 | 5/2005 | Nallan et al. | |
| 6,905,578 B1 | 6/2005 | Moslehi et al. | |
| 6,920,063 B2 | 7/2005 | Huai et al. | |
| 6,933,155 B2 | 8/2005 | Albert et al. | |
| 6,964,928 B2 | 11/2005 | Ying et al. | |
| 6,984,561 B2 | 1/2006 | Herner et al. | |
| 6,984,585 B2 | 1/2006 | Ying et al. | |
| 6,985,385 B2 | 1/2006 | Nguyen et al. | |
| 6,992,359 B2 | 1/2006 | Nguyen et al. | |
| 6,995,422 B2 | 2/2006 | Herner et al. | |
| 7,002,781 B2 | 2/2006 | Sugawara | |
| 7,005,730 B2 | 2/2006 | Verma et al. | |
| 7,009,877 B1 | 3/2006 | Huai et al. | |
| 7,018,878 B2 | 3/2006 | Vyvoda et al. | |
| 7,023,725 B2 | 4/2006 | Saito et al. | |
| 7,023,739 B2 | 4/2006 | Chen et al. | |
| 7,026,673 B2 | 4/2006 | Abraham | |
| 7,057,921 B2 | 6/2006 | Valet | |
| 7,088,609 B2 | 8/2006 | Valet | |
| 7,106,624 B2 | 9/2006 | Huai et al. | |
| 7,109,539 B2 | 9/2006 | Lu | |
| 7,120,049 B2 | 10/2006 | Nakamura et al. | |
| 7,123,498 B2 | 10/2006 | Miyatake et al. | |
| 7,126,201 B2 | 10/2006 | Matsutera et al. | |
| 7,148,531 B2 | 12/2006 | Daughton et al. | |
| 7,170,775 B2 | 1/2007 | Lin et al. | |
| 7,183,130 B2 | 2/2007 | Neutzel et al. | |
| 2002/0048128 A1* | 4/2002 | Kamiguchi et al. | 360/324.1 |
| 2003/0108776 A1 | 6/2003 | Chang et al. | |
| 2003/0123200 A1* | 7/2003 | Nagasaka et al. | 360/324.1 |
| 2003/0128483 A1 | 7/2003 | Kamijo | |
| 2003/0232223 A1 | 12/2003 | Leddy et al. | |
| 2004/0042128 A1* | 3/2004 | Slaughter et al. | 360/324.2 |
| 2004/0130936 A1 | 7/2004 | Nguyen et al. | |
| 2004/0159832 A1 | 8/2004 | Hack | |
| 2004/0170055 A1 | 9/2004 | Albert et al. | |
| 2004/0201070 A1 | 10/2004 | Deak | |
| 2005/0040433 A1* | 2/2005 | Nozieres et al. | 257/200 |
| 2005/0045913 A1 | 3/2005 | Nguyen et al. | |
| 2005/0063222 A1 | 3/2005 | Huai et al. | |
| 2005/0105325 A1 | 5/2005 | Haneda et al. | |
| 2005/0133840 A1 | 6/2005 | Pietambaram et al. | |
| 2005/0167657 A1 | 8/2005 | Nickel et al. | |
| 2005/0195532 A1 | 9/2005 | Sugiyama et al. | |
| 2005/0201020 A1* | 9/2005 | Fuke et al. | 360/324.1 |
| 2005/0207219 A1 | 9/2005 | Lee et al. | |
| 2005/0254287 A1 | 11/2005 | Valet | |
| 2005/0276996 A1 | 12/2005 | Hong et al. | |
| 2006/0017081 A1* | 1/2006 | Sun et al. | 257/295 |
| 2006/0056114 A1* | 3/2006 | Fukumoto et al. | 360/324.2 |
| 2006/0081953 A1 | 4/2006 | Nguyen et al. | |
| 2006/0083056 A1 | 4/2006 | Daughton et al. | |
| 2006/0104110 A1 | 5/2006 | Sun et al. | |
| 2006/0109591 A1 | 5/2006 | Ranjan et al. | |
| 2006/0114620 A1 | 6/2006 | Sbiaa et al. | |
| 2006/0141640 A1* | 6/2006 | Huai et al. | 438/3 |
| 2006/0171198 A1 | 8/2006 | Saito et al. | |
| 2006/0187703 A1 | 8/2006 | Mizuguchi et al. | |
| 2006/0192237 A1 | 8/2006 | Huai | |
| 2006/0227465 A1 | 10/2006 | Inokuchi et al. | |
| 2006/0239066 A1 | 10/2006 | Liaw | |
| 2006/0268604 A1 | 11/2006 | Onogi et al. | |
| 2007/0007609 A1 | 1/2007 | Saito et al. | |
| 2007/0085068 A1 | 4/2007 | Apalkov et al. | |
| 2007/0086121 A1 | 4/2007 | Nagase et al. | |
| 2007/0164336 A1 | 7/2007 | Saito et al. | |
| 2007/0171694 A1 | 7/2007 | Huai et al. | |
| 2007/0201265 A1 | 8/2007 | Ranjan | |
| 2007/0253245 A1 | 11/2007 | Ranjan | |
| 2008/0043519 A1 | 2/2008 | Kitagawa et al. | |
| 2008/0094886 A1 | 4/2008 | Ranjan | |
| 2008/0164548 A1 | 7/2008 | Ranjan | |
| 2008/0180991 A1 | 7/2008 | Wang | |
| 2008/0191295 A1 | 8/2008 | Ranjan | |
| 2008/0225585 A1 | 9/2008 | Ranjan | |
| 2008/0246104 A1 | 10/2008 | Ranjan | |
| 2008/0253174 A1 | 10/2008 | Yoshikawa et al. | |
| 2008/0293165 A1 | 11/2008 | Ranjan | |
| 2009/0646501 | 2/2009 | Ranjan | |
| 2009/0109739 A1 | 4/2009 | Ranjan | |

FOREIGN PATENT DOCUMENTS

| | | |
|---|---|---|
| JP | 2007073971 | 3/2007 |

OTHER PUBLICATIONS

Yingfan, Xu et al.; In situ ordering of FePt thin films with face-centered-tetragonal 001 texture on Cr100ÅxRux underlayer at low substrate temperature; Applied Physics Letters, vol. 80, No. 18, May 6, 2002.

S. Mangin et al.; Current-induced magnetization reversal in nanopillars with perpendicular anisotropy; Nature Materials; Mar. 2005; vol. 5.

F. J. Albert, et al.; Quantitative Study of Magnetization Reversal by Spin-Polarized Current in Magnetic Multilayer Nanopillars; Physical Review Letters; vol. 89, No. 22; Nov. 25, 2002.

Hao Meng, et al.; Current Confined Effect of Magnet Nano-Current-Channel for Magnetic Random Access Memory; The Center for Micromagnetics and Information Technology; Oct. 31, 2006.

L. Berge; Emission of spin waves by a magnetic multilayer traversed by a current; Physical Review; Oct. 1, 1996; vol. 54, No. 13.

G. D. Fuchs, et al.; Spin Torque, Tunnel-Current Spin Polarization, and Magnetoresistance in MgO Magnetic Tunnel Junctions; Physical Review Letters; PRL 96, 186603 (2006); May 12, 2006.

Jun Hayakawa; Current-Driven Magnetization Switching in CoFeB/MgO/CoFeB Magnetic Tunnel Junctions; Japanese Journal of Applied Physics; vol. 44, No. 41, 2005, pp. L 1267-L 1270.

Hao Meng, et al.; Composite free layer for high density magnetic random access memory with lower spin transfer current; Applied Physics Letters 89, 152509; Oct. 12, 2006.

Hao Meng, et al.; Low critical current for spin transfer in magnetic tunnel junctions; Applied Physics Letters; 88; Feb. 23, 2006.

G. D. Fuchs; Spin-transfer effects in nanoscale magnetic tunnel junctions; Applied Physics Letters; vol. 85, No. 7; Aug. 16, 2004.

J.C. Slonezewski; Current-driven excitation of magnetic multi-layers; Journal of Magnetism and Magnetic Materials; Dec. 19, 1995.

G. Consolo, et al.; Spin-torque switching in Py/Cu/Py and Py/Cu/CoPt spin-valve nanopillars; Journal of Magnetism and Magnetic Materials; Mar. 23, 2007.

F. J. Albert; Spin-polarized current switching of a Co thin film nanomagnet; Applied Physics Letters; vol. 77, No. 23; Dec. 4, 2000.

Xiaochun Zhu; Spin Torque and Field-Driven Perpendicular MRAM Designs Scalable to Multi-Gb/Chip Capacity; , vol. 42, No. 10, Oct. 2006.

C. J. Sun, et al.; Epitaxial L1o FePt magnetic thin films sputtered on Cu (001); Applied Physics Letters; vol. 82, No. 12; Mar. 24, 2003.

J. A. Katine et al.; Current-Driven Magnetization Reversal and Spin-Wave Excitations in CoCuCo Pillars; Physical Review Letters; vol. 84; Apr. 3, 2000.

Counterpart for China Application, 200880011839.8, CPEL0952038P

Counterpart for European Application, EP08729568.9.

Counterpart for Korean Application, 10-2009-7019022 Corresponding to PCT/US2008/053623.

Counterpart for China Application, 200880011854.2, CPEL0952060P.

Counterpart for European Application, EP08729570.5.

Counterpart for Korean Application, 10-2009-7019004 Corresponding to PCT/US2008/053625.

PCT/US2008/053623; WO 2008/100871.
PCT/US2008/053625; WO 2008/100872.
PCT/US2008/053619; WO 2008/100868.
PCT/US2008/053621; WO 2008/100869.
PCT/US2008/053624; WO 2009/058410.

PCT/US2008/065066; WO 2009/108212.
PCT/US2008/065067; WO 2009/108213.
PCT/US2008/080782; WO 2009/058634.
PCT/US2009/068586; WO 2010/080542.

* cited by examiner

NON-VOLATILE MAGNETIC MEMORY WITH LOW SWITCHING CURRENT AND HIGH THERMAL STABILITY

CROSS REFERENCE TO RELATED APPLICATIONS

This application is a continuation-in-part of U.S. patent application Ser. No. 11/674,124 entitled "Non-uniform Switching Based Non-Volatile Magnetic Base Memory", filed on Feb. 12, 2007 and a continuation-in-part of U.S. patent application Ser. No. 11/678,515 entitled "A High Capacity Low Cost Multi-State Magnetic Memory", filed on Feb. 23, 2007, the disclosures of which are incorporated herein by reference, as though set forth in full.

BACKGROUND OF THE INVENTION

1. Field of the Invention

The present invention relates generally to non-volatile magnetic memory and particularly to non-volatile magnetic memory with low switching current and high thermal stability.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash would be extremely difficult to scale below 45 nanometers (nm). Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies, such as Ovanic Ram (or phase-change memory), Ferro-electric Ram(FeRAM), Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art memory structures is that the current and power requirements are too high to make a functional memory device or cell. This also poses a key concern regarding the reliability of such devices due to likely dielectric break-down of the tunneling barrier layer and thereby making it non-functional.

The challenge with other prior art techniques has been that the switching current is too high to allow the making of a functional device for memory applications due to the memory's high power consumption. Several recent publications have shown that the switching current can be reduced by having the memory element pinned by two anti-ferromagnetic (AF)-couple layers resulting in spin oscillations or "pumping" and thereby reducing the switching current.

In certain non-volatile magnetic memory cells, while switching current has been lowered, thermal stability has also been lowered as a result thereof. That is, attempts to lower the switching current are known to lead to lower thermal stability. Low thermal stability is undesirable because, among other reasons, it leads to unwanted switching of magnetic moment.

What is needed is non-volatile magnetic memory having low switching current and high thermal stability.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the present invention includes a non-volatile current-switching magnetic memory element including a bottom electrode; a pinning layer formed on top of the bottom electrode; a fixed layer formed on top of the pinning layer; a tunnel layer formed on top of the pinning layer; a first free layer formed on top of the tunnel layer; a granular film layer formed on top of the first free layer; a second free layer formed on top of the granular film layer; a cap layer formed on top of the second free layer; and a top electrode formed on top of the cap layer.

These and other objects and advantages of the present invention will no doubt become apparent to those skilled in the art after having read the following detailed description of the preferred embodiments illustrated in the several figures of the drawing.

IN THE DRAWINGS

Figure 4A:
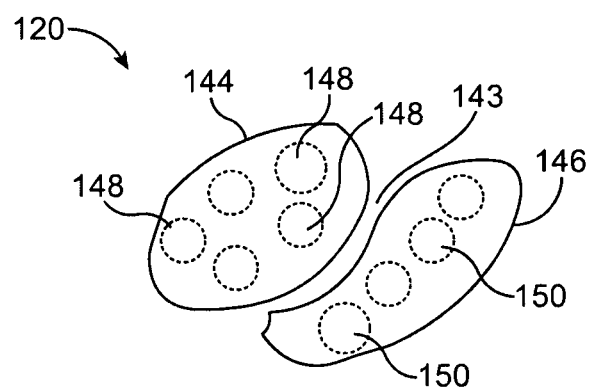
Figure 4B:
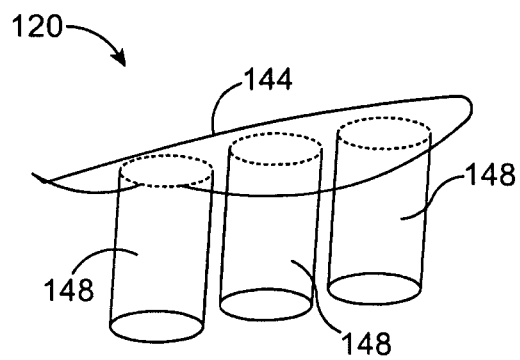

FIGS. 4(a) and 4(b) each show further details of the layer 120 of the memory element 100.

Figure 5:
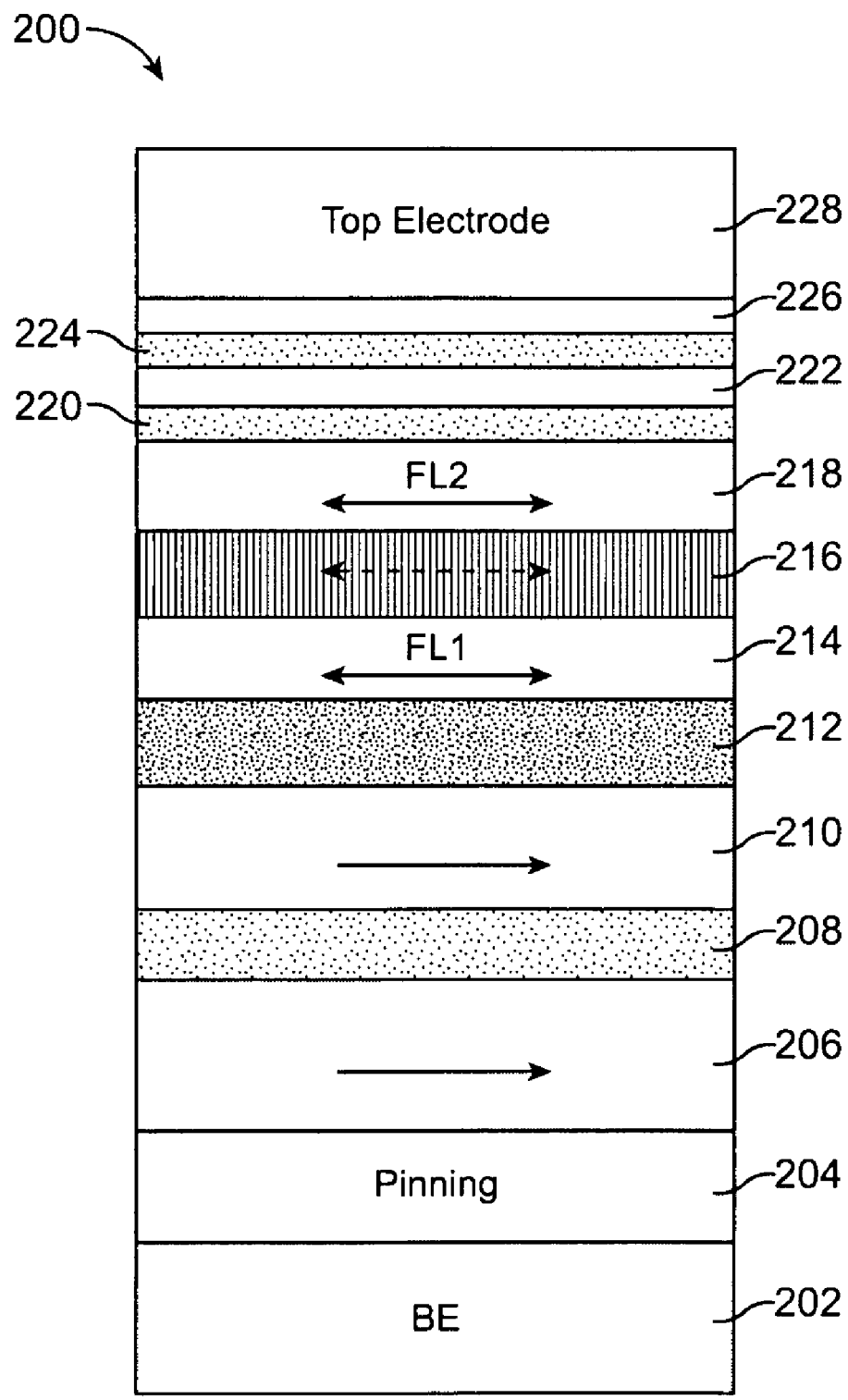

FIG. 5 shows a non-volatile current-switching magnetic memory element 200 in accordance with another embodiment of the present invention.

Figure 6:
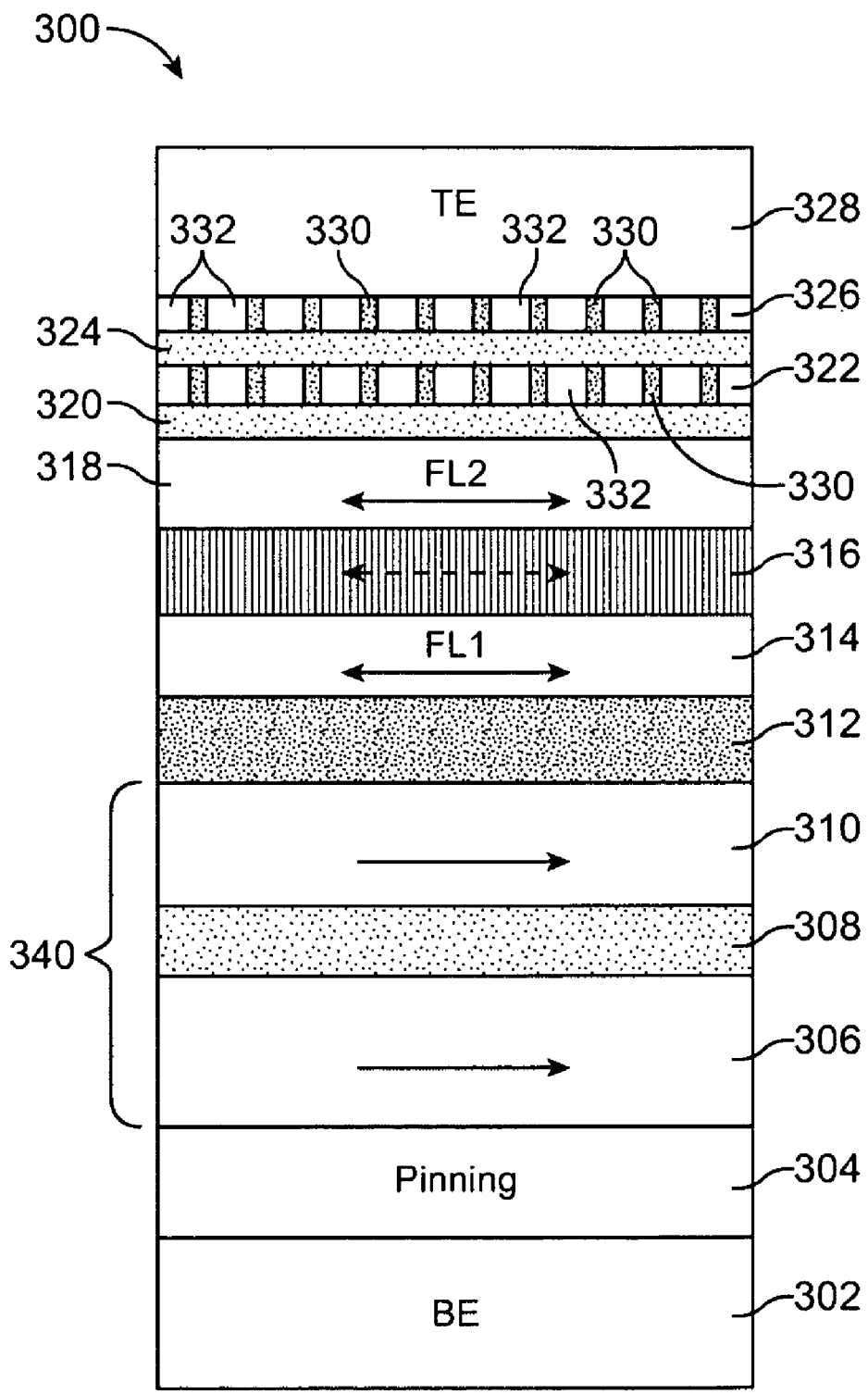

FIG. 6 shows a non-volatile current-switching magnetic memory element 300 in accordance with yet another embodiment of the present invention.

Figure 7:
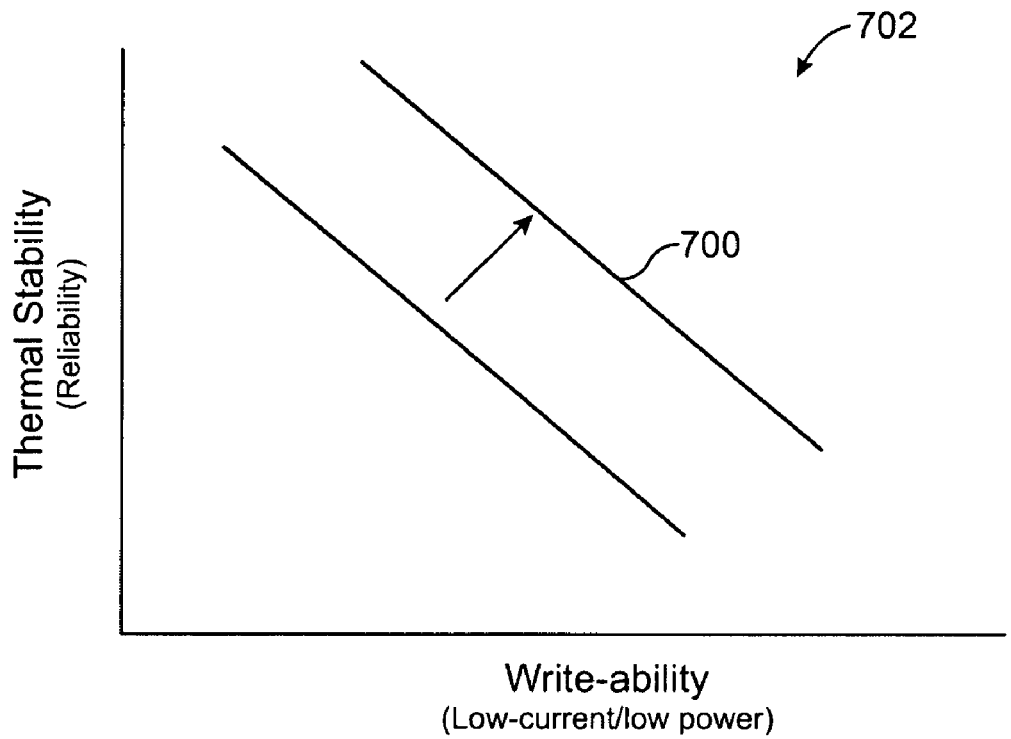

FIG. 7 shows a graph 702 of the thermal stability (shown on the y-axis) relative to the write-ability (shown on the x-axis).

Figure 8:
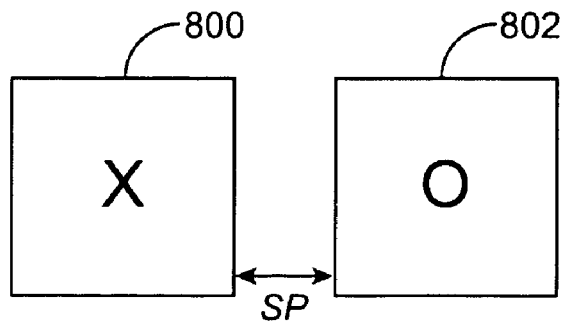
Figure 9:
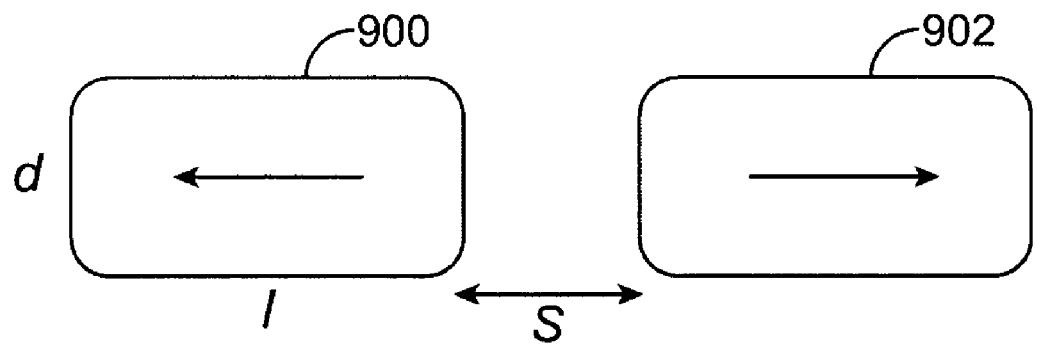
Figure 10:
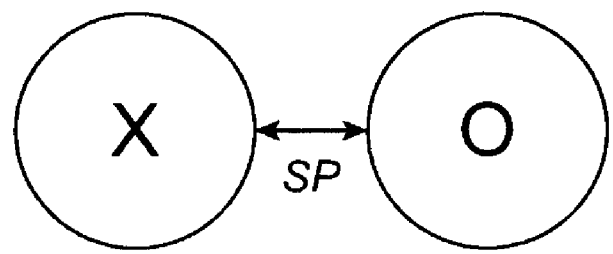

FIGS. 8-10 show distances between memory cells made of the various memory elements of the embodiments of the present invention.

Figure 11:
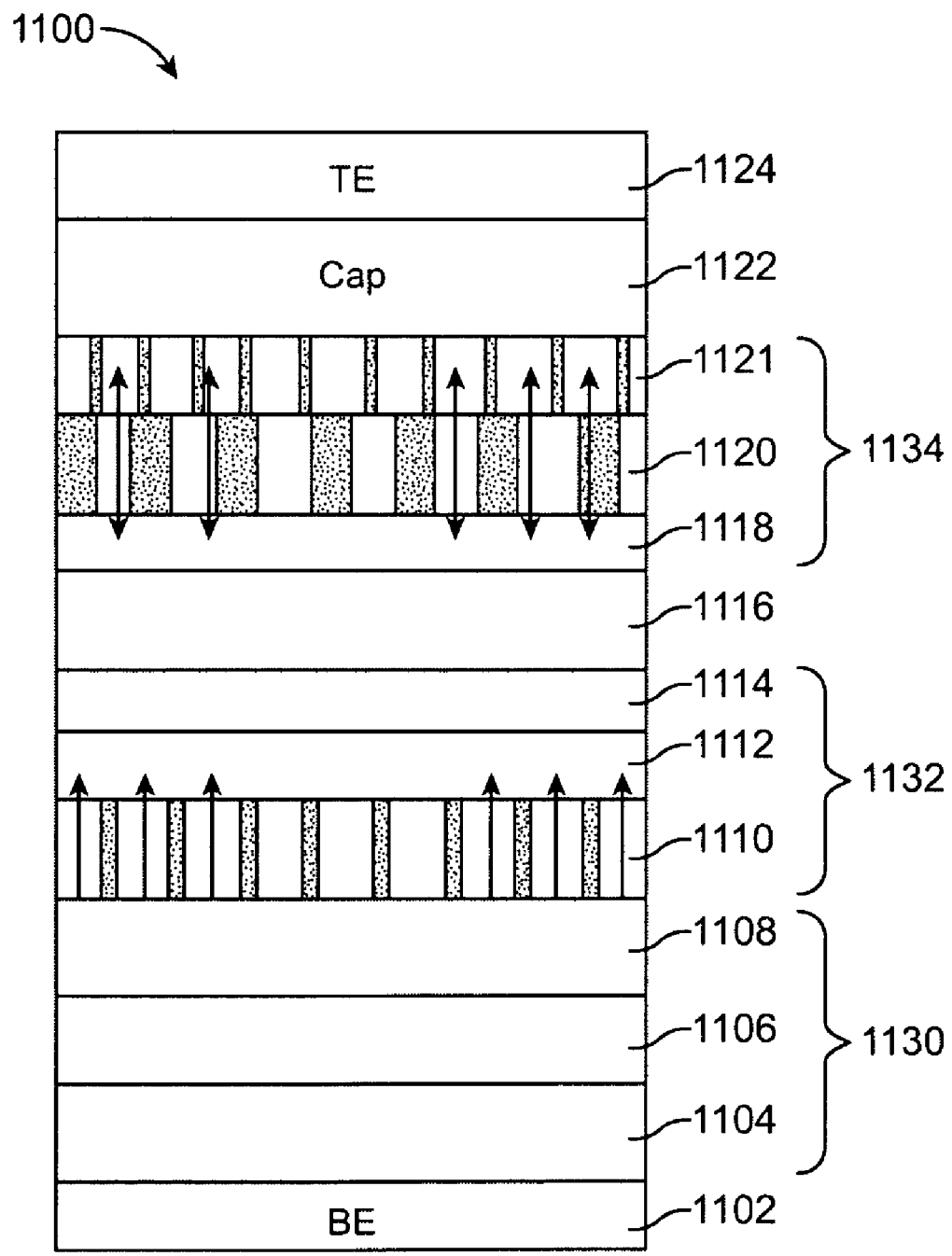

FIG. 11 shows the memory element 1100, in accordance with another embodiment of the present invention.

Figure 12:
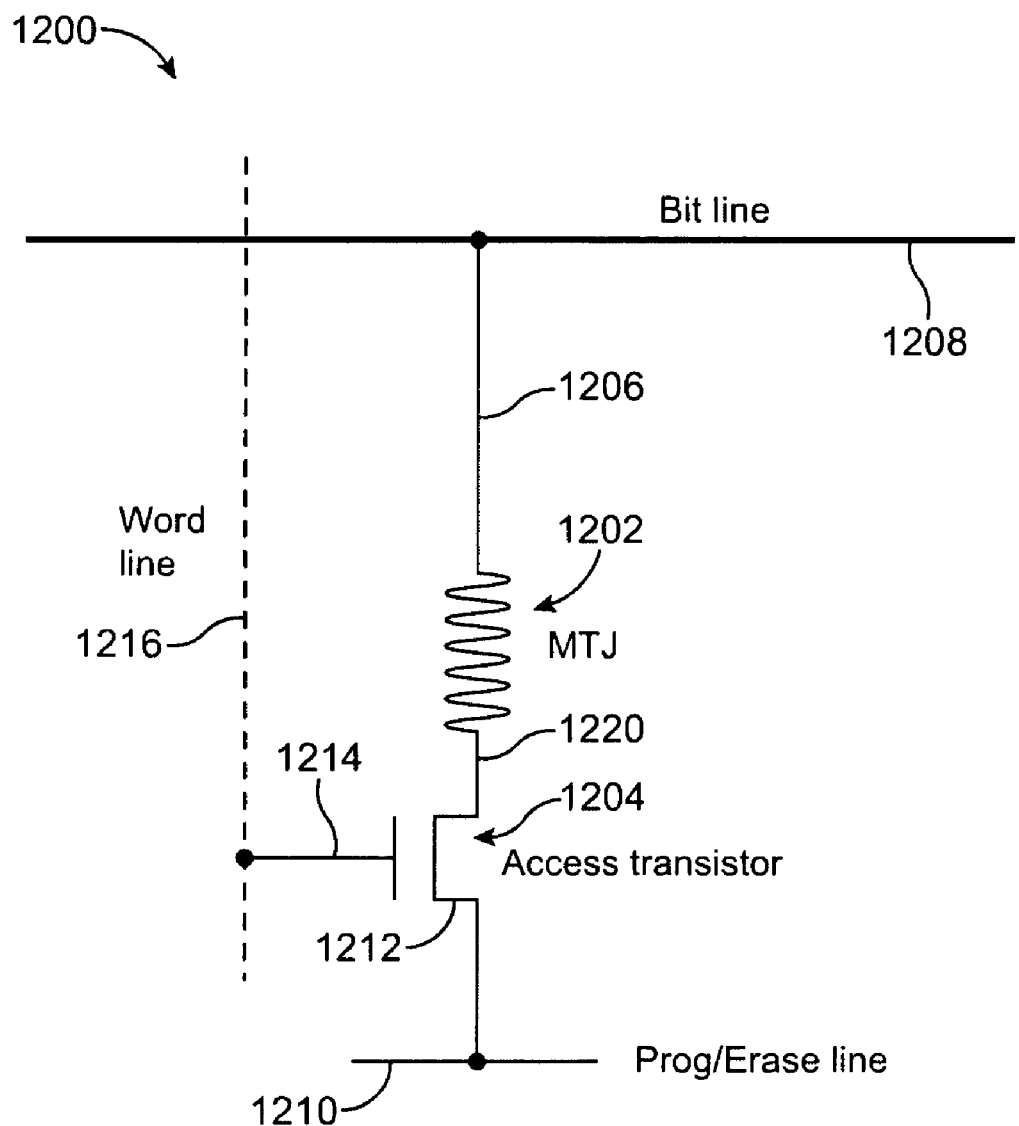

FIG. 12 shows a memory architecture incorporating the memory elements of the various embodiments of the present invention.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a magnetic memory cell is disclosed. In one embodiment of the present invention, a magnetic tunnel junction (MTJ) is formed of at least three layers, a barrier (or tunnel) layer formed between a fixed layer and a free layer for storing digital information.

Figure 1:
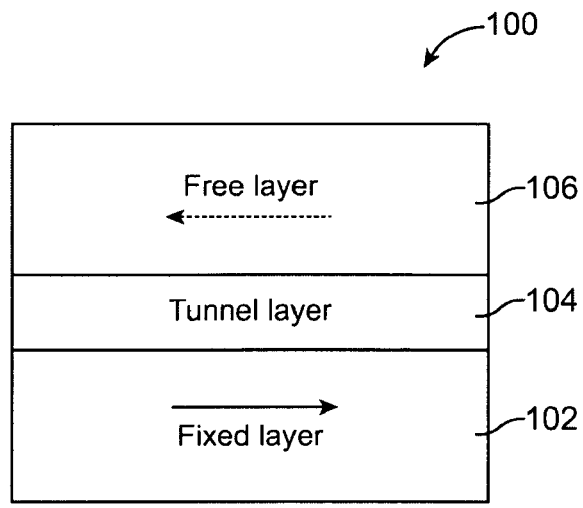
FIG. 1 shows relevant layers of a non-volatile current-switching magnetic memory element 100 are shown, in accordance with an embodiment of the present invention.

Referring now to FIG. 1, relevant layers of a non-volatile current-switching magnetic memory element 100 are shown, in accordance with an embodiment of the present invention. The memory element 100 is shown to include a fixed layer 102 on top of which is formed a tunnel layer 104 on top of which is formed a free layer 106. In the embodiment of FIG. 1, the free layer is multi-layered, as shown in FIG. 2.

Figure 2:
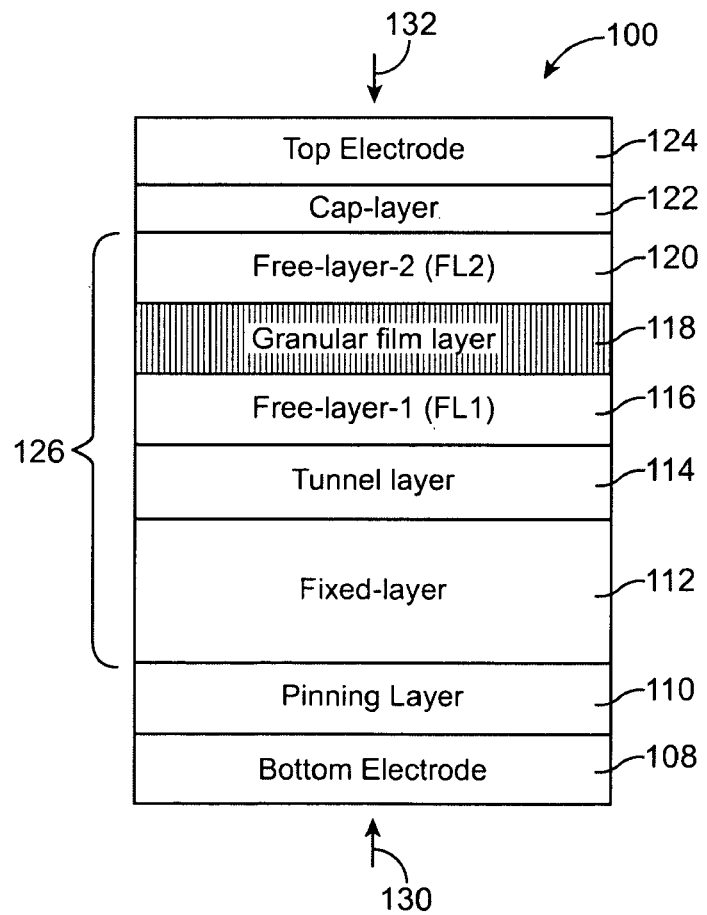
FIG. 2 shows further layers of the memory element 100, in accordance with an embodiment of the present invention.

FIG. 2 shows further layers of the memory element 100, in accordance with an embodiment of the present invention. In FIG. 2, a bottom electrode 108 is shown and deposited on a substrate and on top of the bottom electrode 108 is shown formed a pinning layer 110 on top of which is shown formed a fixed layer 112, on top of which is shown formed a tunnel (or barrier) layer 114, on top of which is shown formed a free layer 116, on top of which is shown formed a granular film layer 118, on top of which is shown formed a free layer 120, on top of which is shown formed a cap layer 122, on top of which is shown formed a top electrode 124. The top electrode 124 and the bottom electrode 108 are each made of Tantalum (Ta) in an exemplary embodiment although other suitable materials are contemplated. This layer may contain additional non-magnetic layers the choice of which depends on the choice of the "etching" process which is used to define the magnetic memory element, as described below. For example, the etching process of choice is typically a reactive-etching process including gases such as carbon monoxide (CO), ammonia ($NH_3$), chlorine ($Cl_2$) due to its faster etching rate. Other choice may include ion-beam etching which is generally slower than the reactive-etching process but has different selectivity in regards to the relative etching rates of the various atomic elements of the different layers of the magnetic-memory cell. The layers 112 through 120 are shown to form a MTJ 126.

In FIG. 2, the MTJ 126 is for storing a bit of information or two states, '1' and '0', with a single bit representing two binary states, i.e. '1' and '0'. Exemplary material from which the various layers of the memory element 100 are made and their respective exemplary thicknesses will now be presented. It should be noted that these material and sizes are merely examples and other suitable types of material and sizes of these layers are anticipated.

In FIG. 2, the layers 116 through 120 make up the layer 106 of FIG. 1. Likewise, the layer 112 of FIG. 2 is the same as the layer 102 of FIG. 1. The layer 114 of FIG. 2 is the same as the layer 104.

In one embodiment of the present invention, the layer 114 is made of magnesium oxide (MgO). In other embodiments, the layer 114 may be made of titanium oxide($TiO_2$), aluminum oxide ($Al_2O_3$), Magnesium oxide (MgO), tantalum oxide ($Ta_2O_5$), hafnium oxide ($HfO_2$), zirconium oxide ($ZrO_2$), tantalum nitride (TaN), strontium oxide (SrO) or ruthenium oxide (RuO). The layers 116 and 120 are each typically less than 20 nm in thickness and typically have a ratio, in thickness of 5 to 1. The layer 116 is typically made of magnetic material whose grains are exchange coupled. The alloy in the layer 116 comprises of one or many of cobalt(Co), iron(Fe) and nickel(Ni) with less than 16 atomic percent of boron and contains less than 10 atomic percent of any other non-magnetic elements chosen from chromium(Cr), tantalum(Ta), zirconium(Zr), hafnium(Hf).

The layer 120 is typically made of magnetic material whose grains are weakly exchange coupled. The alloy in the layer 120 is typically one or many of ferromagnetic elements Co, Fe and Ni, and contains less than 20 atomic percent of platinum, Pt. It also contains up to 20 atomic percent of one or more of the following elements: phosphorous (P), boron(B), chromium(Cr), tantalum(Ta), tungsten(W), molybdenum (Mo).

The top electrode 124 and the bottom electrode 108 are each made of Tantalum (Ta) in an exemplary embodiment although other suitable materials are contemplated per the requirements of the etching process.

The layer 110 is an anti-ferromagnetic (AF) pinning layer. More specifically, for example, the magnetic moment of the layer 110 helps to pin the magnetic moment of the layer 112. The magnetic moment of the layer 110 is permanently fixed.

The layer 118 is a granular layer which is used to obtain lower switching current of the memory element during the "program" or write or "erase" operations to the memory element. The layer 118, in one embodiment of the present invention, is made of $(Co_xFe(1-x))(Z)$ where, x the atomic percent and can be a value in the range of 0 to 1 where 1 refers to 100 atomic percent. Z is typically a compound chosen from any of the following list of compounds and can be a mixture of these: Titatnium oxide($TiO_2$), silicon oxide($SiO_2$), tantalum oxide($Ta_2O_5$), tungsten oxide (WO), Aluminum oxide ($Al_2O_3$), tantalum nitride(TaN), titanium nitride(TiN). One of the selection criteria for selection of compound Z is that it should have a high heat of formation and other being low solubility in the base magnetic alloy Co—Fe. This enables "granular" micro-structure of this film during deposition by having the base elements couple together to form the center of the grains which are isolated from each other by compound Z which tend to segregate at the grain-boundary regions.

The layer 122 is the cap layer has a substantially cubic crystal structure having a closer lattice match with cubic Cobalt or cubic cobalt alloys. It is essential that the fixed layer 112, tunnel layer 114 and free-layers 116 and 120 be substantially amorphous or nano-crystalline following deposition. These are then annealed, typically combined with the magnetic anneal process which is used for setting the pinning layer as well as the orientation of the fixed layer. It is important that this also coincides with the magnetic anisotropy direction which arises from two effects namely, the shape which is kept elongated with the long axis aligned with the preferred direction and the applied magnetic field direction during deposition of the fixed and free-layers. The annealing temperature is typically over 350 C degrees and the time is typically greater than an hour. The heat energy from annealing causes the layer 114 in conjunction with the adjacent amorphous magnetic layers of 112, 116 and 120 to transform into cubic (001) structure which has been shown to form coherent channels leading to very high TMR. By choosing a proper cubic cap-layer, the cubic transformation is facilitated with ease at a lower temperature.

The layer 122, in one embodiment of the present invention, is made substantially of one or more of the following layers: RuCr, NiAl, NiRu, NiAlRu, NiZr, Cu/Ru, Au/Ru. A typical thickness of this layer is 5-50 nm. In one embodiment, RuCr having 30 atomic percent chromium, Cr, is used as the caplayer.

Typical thicknesses for each of the layers of the memory element 100 are now presented. However, these sizes are merely examples, as other thicknesses are anticipated. A typical thickness of each of the top electrode 124 and the bottom electrode 108 is 30 to 200 nm. While a preferred thickness is typically 50 nm, the actual thickness choice may depend on the requirements from the metallization process as well as the etching process. The layer 110 is typically 20 to 100 nm in thickness with a preferred thickness of 25-50 nm.

In one embodiment of the present invention, the layer 112 is multi-layered. In an exemplary embodiment, the layer 112 is made of three layers of Cobalt-Iron(CoFe)/Ruthenium (Ru)/Cobalt-Iron-Boron(CoFeB) with CoFe layer is formed adjacent to or on top of the layer 110 and the CoFeB layer is formed adjacent to or below the layer 114 so that between the layers 110 and 114 are CoFe on top of which is formed Ru on top of which is formed CoFeB. The typical thickness of the CoFe layer is 3 to 10 nm and that of Ru layer is 0.6 to 1.0 nm to create anti-ferromagnetic coupling between the two adjacent magnetic layers of CoFe and CoFeB. The CoFeB layer is typically 2 to 10 nm thick with a preferred range of 2.5 to 5 nm.

The barrier (or tunnel) layer 114 has a typical thickness of 0.8 to 3 nano meters (nm).

During manufacturing, the layers of the memory element 100 are formed in the manner described hereinabove. Additionally, an annealing process, which is well known, is performed heating the memory element 100 in the presence of a magnetic field. Following the annealing process, the magnetic moments of the layer 112 are oriented in a particular orientation.

During operation, current is applied, in a direction that is substantially perpendicular relative to the plane of the magnetic layers of the memory element 100 of FIG. 2, either from a direction indicated by the arrow 130 or a direction indicated by the arrow 132. When current is applied, depending on the level of current and the direction of the current, the magnetic moment of the layers 116 and 120 are caused to be switched to an opposite direction, or left in the same in-plane direction as that of the layer 112.

The state of the magnetic moment of the MTJ 126 defines the state of the memory element 100. It is important to note that the alloy of which the layer 120 is made is different than that from which the layer 116 is made. The layer 116 is magnetically more exchange coupled than the layer 120. The structure of the free layer 106, as depicted in FIG. 2, has the grains of the layer 120 are magnetically weekly exchange-coupled from each other. During the switching process, at the time of programming and erasing, it is not until a substantial number of magnetic grains of layer 120 have switched that these grains couple together and build a critical volume to cause an avalanche type switching of the rest of the grains of 120. Once the grains are switched they are magnetostatically coupled together with the neighboring grains leading to an increased "magnetic volume". This results in high thermal stability while lower switching current is experienced. Perhaps a greater understanding of this concept is had with respect to further details of the structure of the layer 120, relative to subsequent figures.

Figure 3:
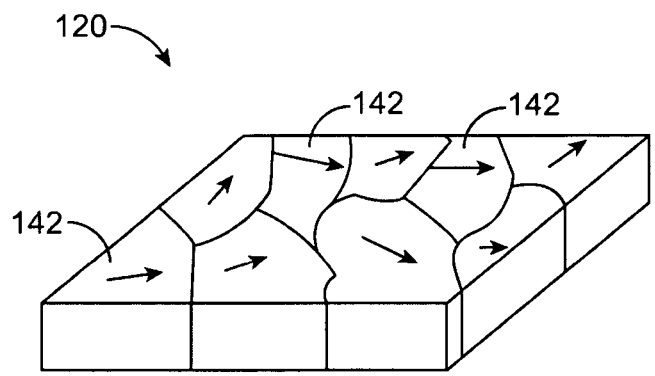
FIG. 3 shows further details of the layer 120, in accordance with an embodiment of the present invention.

FIG. 3 shows further details of the layer 120, in accordance with an embodiment of the present invention. In FIG. 3, a perspective side view of the layer 120 is shown to include a number of grains 142. Before the magnetic moment of the layer 120 is switched, for example, prior to applying current, the direction of the magnetic moment of each of the grains 142, as shown by the direction of their respective arrows therein, is random. When current is applied, the direction of the magnetic moment of each of the grains 142 starts to switch but it is not until at least a substantial number of magnetic moments of the grains have switched when the magnetic moment of the layer 120 switches. While not shown in FIG. 3, the grains 142 are weakly magnetically exchange-coupled by grain boundaries, which causes weak coupling between the grains. This is perhaps better understood relative to FIGS. 4(a) and 4(b). FIGS. 4(a) and 4(b) each show further details of the layer 120 of the memory element 100.

In FIG. 4(a), two grains are shown as grain 144 and grain 146. The grains 144 and 146 are separated from each other by a grain boundary 143. The grain boundary 143 causes weak magnetic exchange-coupling of the grains, primarily from the selection of the alloy as well as the process conditions which causes the non-magnetic constituent of the alloy of layer 120, such as chromium(Cr), boron(B), etc. to segregate at the grain boundary 143. Until all or a substantial number of magnetic grains of a grain have switched their magnetic moment at which time a grain is coupled to its neighboring grain through magneto-static coupling. The grain 144 is shown to be touching magnetic grains 148 of the granular layer 118 and the grain 146 is shown to be touching magnetic grains 150 of the granular layer 118. When current is applied to the memory element 100, the magnetic moment of each of the grains 150 of the granular layer 118 and each of the magnetic moments 148 of the granular layer 118 start switching which causes the magnetization of grains 144 and 146 to switch, and when a substantial number of magnetic grains of either of the grains 144 and 146 have switched, its respective grain couples to its neighboring grains of layer 120.

FIG. 4(b) shows a three dimensional view of the grain 144 with magnetic grains 148 of the granular layer 118. The latter are shown to be cylindrical in shape. A discussion of the physics of the structure of the magnetic moment 100 is now briefly presented.

The current-switching effect of the magnetic moment 100 arises from the interaction between magnetic moments and the transport current. This results from current-induced magnetic field and spin-torque from the current induced spin polarization. While the current-induced effect through the magnetic field is directly proportion to r (r being the distance, the later spin-torque effect is proportional to $r^2$. The torque generated by spins through the momentum transfer of tunneled polarized spins from the layer 112, which opposes the "intrinsic" damping of spins of the free layer (or layer 106). At sufficient current, this can reverse the direction of the magnetization in the free layer, as shown by the direction of the arrow in the layer 106 relative to that of the layer 102, in FIG. 1. In one embodiment the current required to switch the memory element (program or write current) of size 200 nm*130 nm, using the 130 nm CMOS process, is about 300 micro-amps. In a yet another embodiment, the program current for a memory element of size 120 nm*90 nm, using 90 nm CMOS process, is about 200 micro-amps.

The critical current required for such switching is defined in Eq. (1), as follows:

$$Ic = Ic_0[1-(k_BT/K_uV)\ln(t_p/t_0)]$$ Eq. (1)

Where $Ic_0$ is the critical switching current density without thermal fluctuation; $k_B$ is the Boltzman constant; T is temperature; $K_u$ is effective uniaxial anisotropy and V is the volume of the free-layer 106; $t_0$ is the inverse of the procession frequency of the spin (less than 1 ns); $t_p$ is the pulse width of the switching current.

One common way to reduce the critical switching is by reducing either $K_u$ or V of the free layer. Additionally, the switching current can be reduced by lowering the thickness of the free layer but this may compromise the reliability by making the memory element more thermally unstable. A memory element with its free layer having higher KuV is more thermally stable at higher temperatures. As a general rule of thumb, the magnetic energy, KuV, of the free layer is greater than approximately 80 $k_BT$ where, $k_B$ is the Boltzmann constant and T is the ambient temperature.

The various embodiments of the present invention use magnetization reversal taking place in nano-seconds time scale, and the relative strengths of inter-granular exchange coupling and magnetostatic coupling between the neighboring grains to increase thermal stability while maintaining low switching current. The exchange coupling is generally much stronger than the magnetostatic coupling. This could lead to a different value of "V" corresponding to the switching volume and the volume responsible for keeping the thermal stability. More specifically, in the embodiments of the present invention, ways to keep the switching volume small are disclosed while keeping the "volume" responsible for thermal stability large. This results in a lower "writing" or "programming" current while maintaining higher thermal stability. Exchange coupling occurs at spin-to-spin level and is short range coupling and advantageously weaker in the layer 120, while, magnetostatic coupling depends on the distance between grains, which are typically on the order of a few angstroms. Due to the difference in material between the layers 120 and 116, the volume of each of the layers 120 and 116 is multiplied by $K_u$ to yield $K_u(V_1+V_2)$ or $K_1V_1+K_2V_2$ where $V_1$ is the volume of the layer 116 and $V_2$ is the volume of the layer 120.

FIG. 5 shows a non-volatile current-switching magnetic memory element 200 in accordance with another embodiment of the present invention. The memory element 200 is shown to include a bottom electrode 202 on top of which is formed a pinning layer 204 on top of which is formed a ferromagnetic layer 206 on top of which is formed a synthetic anti-ferromagnetic coupling layer 208 on top of which is formed a ferromagnetic layer 210 on top of which is formed a tunnel (or barrier) layer 212, on top of which is shown formed a ferromagnetic layer 214, on top of which is shown formed a granular ferromagnetic layer 216, on top of which is shown formed a ferromagnetic layer 218, on top of which is shown formed a synthetic anti-ferromagnetic coupling layer 220, on top of which is formed a super-paramagnetic layer 222, on top of which is shown formed a synthetic anti-ferromagnetic coupling layer 224, on top of which is shown formed a super-paramagnetic layer 226, on top of which is shown formed a top electrode 228. The layers 224 and 220 are generally magnetic coupling layers. In an exemplary embodiment, these layers are each between 6 to 9 angstroms in thickness. The layers 214 and 218, while both free layers, are each made of material that is different than the other, such as discussed relative to the layers 120 and 116 of FIG. 2. In another embodiment however, the same material is used for both layers 218 and 214. The layer 216 is made of the same material and is generally the same size as that of the layer 118 of FIG. 2. Similarly, the layer 204 is the same as that of the layer 110 and the electrodes 202 and 228 are the same as the electrodes 108 and 124.

In an exemplary embodiment, the layer 206 is made of CoFe and has a thickness in the range of 3 to 25 nm. The layer 208 is made of Ru or RuCr having less than 30 atomic percent of chromium, Cr, and is 12-20 angstroms in thickness. The layer 208 is advantageously thicker than each of the layers 224 and 220.

The layers 224 and 220 are each made of super paramagnetic material having the characteristic of lacking a magnetic state (preferred anisotropy) at room temperature. This is essential in overcoming a prior art problem of using certain magnetic material that exhibit magnetic preferred anisotropy at room temperature, whereas, super paramagnetic material do not. For example, super paramagnetic materials are generally between 10-30 $K_BT$ at room temperature.

As in the case of the embodiment of FIG. 2, the layers 112 through 120 make up a MTJ. Furthermore, in FIG. 5, the layers 214 through 226 comprise the free layer, such as the free layer 106 of FIG. 1.

The embodiment of FIG. 5 shows the free layer to be multi-layered and using super paramagnetic material as some of the multiple layers. As noted earlier, the layers 220 and 224 are made of Ru, in one embodiment of the present invention. The layers 226 and 222 are made of RuCr, having less than 40 atomic percent of chromium, Cr, in an exemplary embodiment of the present invention. The thickness of layers 222 and 226 are typically kept below 10 nm. In one exemplary embodiment it is less than 2 nm thick of Co(30 at %)Fe(50 at % Cr(10 at %)B(10 at %) where at % refers to the atomic percent of the constituent element. In a yet another exemplary embodiment these layers are less than 3 nm and contain less than 20 atomic percent of nickel, Ni.

The embodiment of FIG. 5 offers added volume for the free layer than that of the embodiment of FIG. 2. Advantageously, added volume is achieved without impacting the switching current by the memory element 200 of FIG. 5.

The layer 216 has the same structure and exhibits the same characteristics as those discussed relative to the layer 118 of FIG. 2 and the layer 218 similarly has the same structure and exhibits the same characteristics as those discussed relative to the layer 120 of FIGS. 3, 4(a) and 4(b).

In operation, whenever the magnetic moment of the layer 218 switches or flips to an opposite direction than, for example, an in-plane direction("left" or "right" as marked by the arrows), the layers 220 and 224 follow suit. Before such time however, the direction of the magnetic moments of the layers 224 and 220 are random. More specifically, the magnetic moment of the layers 214 and 218 switch direction followed by the magnetic moment of the layers 220 and 224 switching direction to take on an orientation or direction that is the same as that of the layer 218. In this manner, the free layer that includes the layers 214 through 226, in essence, has a greater volume than that of the embodiment of FIG. 2 and that of prior art structures, allowing for greater thermal stability while maintaining low switching current.

In an exemplary embodiment of the present invention, the thermal stability of memory cell of dimensions 60 nm*45 nm made using 45 nm process goes up from 79 $K_BT$ to 112 $K_BT$ by adding 1.5 nm thick layers of 222 and 226 using a CoFeNiB film having a magneto-crystalline anisotropy of about $2*10^5$ erg/cc, while maintaining the same program/erase current of about 100 micro-amps. In a yet another exemplary embodiment, the thickness of layer 218 and 214 are kept at less than 2 nm for a 90 nm*120 nm memory cell using 90 nm process has a thermal stability of 181 $K_BT$ while having a program/erase current of about 200 micro-amps.

FIG. 6 shows a non-volatile current-switching magnetic memory element 300 in accordance with yet another embodiment of the present invention. The memory element 300 is shown to include a bottom electrode 302 on top of which is formed a pinning layer 304 on top of which is shown formed a multi-layered fixed layer 340. The layer 340 is shown having multiple layers and in one embodiment of the present invention, it is shown comprising the ferromagnetic layer 306, which is shown formed on top of the layer 304 and on top of the layer 306 is shown formed a synthetic anti-ferromagnetic coupling layer 308 on top of which is shown formed a substantially amorphous ferromagnetic layer 310. The layers 306 through 310 are shown to form the fixed layer 340. In an exemplary embodiment, the layers 306 through 310 are made of Cobalt-Iron(CoFe), Ruthenium(Ru) and Cobalt-Iron-Boron(CoFeB), respectively.

On top of the layer 310 of the fixed layer 340 is shown formed a tunnel (or barrier) layer 312. On top of the layer 312 is shown formed a free layer 314 on top of which is shown formed a granular film layer 316, on top of which is shown formed a free layer 318, on top of which is shown formed a magnetic coupling layer 320, on top of which is shown formed a super paramagnetic granular layer 322 on top of which is shown formed a magnetic coupling layer 324, on top of which is shown formed a super paramagnetic granular layer 326, on top of which is shown formed a top electrode 328.

The layers 326 and 322 are shown to each include magnetic regions 332 dispersed between non-magnetic regions 330. In one embodiment of the present invention, the regions 332 are made largely of cobalt(Co), Iron(Fe), Nickel(Ni) and boron (B) and the -regions 330 are made of titanium oxide($TiO_2$), silicon oxide($SiO_2$), tantalum oxide($Ta_2O_5$), tungsten oxide (WO), Aluminum oxide($Al_2O_3$), tantalum nitride(TaN), titanium nitride(TiN). In an embodiment of the present invention, the layers 320 and 324 are each made of Ru or RuCr. The regions 322 and 326 are each of super paramagnetic material but they each have less oxide or nitride in layers above them thereby exhibiting stronger magneto-static coupling with neighboring layer and no exchange coupling between neighboring grains. This enables addition of additional "magnetic" volume to the free-layer and thereby increasing the thermal stability without impacting the switching current or the program/erase current. The super-paramagnetic regions 322 and 326 do not have any preferred anisotropic direction of their own. Once the free-layers 314, 316 and 318 switch either to the "left" or to the "right" as marked by arrow, the regions 322 and 326 couple to them and take their direction and there by add "magnetic volume" to enhance the thermal stability without impacting the impacting the program/erase current, also referred to as the write-ability. As shown in the FIG. 7, 702 is a plot of thermal-stability versus write-ability. The approaches taught per this invention enable the performance to move into curve 702 which may or may not be exactly parallel but would lie on the right side of the curve which essentially implies higher thermal stability for same write-ability. Depending upon the memory cell design and choice of materials, the write-ability and the thermal stability can be traded or compromised against one-another.

In a yet another embodiment shown in FIG. 8, the memory element 800 and 802 are shown to have substantially "perpendicular" magnetic moments with-respect to the substrate-wafer surface (or the x-axis in plane with the page). As shown in FIG. 8, memory cells, made up of the memory element 800 and 802, advantageously, enables closer spacing between neighboring cells thereby enabling higher density, as compared to the in-plane oriented memory cells shown in FIG. 9. In the in-plane oriented memory cells of FIG. 9, the spacing, s, which is the distance between the memory cells 900 and 902, is limited by the magnetic interaction field between the adjacent magnetic memory cells. The minimum spacing scales with lithography technology. Thus, use of the memory element 800 and 802 results in dense or more compact memory, which is clearly desirable for reasons among which are cost and size.

It should be noted that while few perpendicular designs have been suggested based on Co/Pt multi-layers, they suffer from having extremely high switching currents and thereby making such designs unsuitable for memory applications. Additionally, such designs are based on Co/Pt multi-layers and therefore difficult to manufacture thereby making them more expensive.

The memory cells 800 and 802 of FIG. 8, made of the memory element 1100 are substantially perpendicular to the substrate surface having a shape substantially square (in-plane). FIG. 10 shows another example of memory cells that are substantially round in shape. These memory cells have a much closer spacing between the adjacent memory cells, i.e. memory cells 800 and 802, the space between the memory cells 800 and 802 being sp, compared to the memory cells having in-plane as shown in FIG. 9.

FIG. 11 shows the memory element 1100, in accordance with another embodiment of the present invention having substantially "perpendicular" magnetic moments with-respect to the substrate-wafer surface (or the x-axis in plane with the page). In FIG. 11, the memory element 1100 is shown to include a bottom electrode 1102, on top of which is shown formed a seeding layer 1130 on top of which is shown formed a fixed layer 1132, on top of which is shown formed a tunnel layer 1116, on top of which is shown formed a free layer 1134 on top of which is shown formed a cap layer 1122, on top of which is shown formed a top electrode 1124. The cap layer 1122, as in all of the cap layers of the embodiments discussed and shown herein is generally non-magnetic. The layers 1132, 1116 and 1134 comprise a MTJ in the embodiment of FIG. 11.

The layer 1130 is shown to be multi-layered. In an exemplary embodiment, the layer 1130 is formed of a CoFeB—Cr—Z layer 1104, which is shown formed on top of the bottom electrode 1102 and on top of the layer 1104 is shown formed a non-magnetic layer 1106 and top of the layer 1106 is shown formed a Ru—X layer 1108 where X is one or many of chromium, Cr, molybdenum, Mo, tantalum, Ta, and tungsten, W. The layers 1104, 1106 and 1108 comprise the layer 1130.

The layer 1132 is shown to be multi-layered. In an exemplary embodiment, the layer 1132 is formed of a CoCrPt—X layer 1110, which is shown formed on top of the layer 1108 and on top of the layer 1110 is shown formed a CoCrPtB layer 1112 and top of the layer 1112 is shown formed a CoFeB—Y layer 1114. The layers 1104, 1106 and 1108 comprise the layer 1130. The tunnel layer, in an exemplary embodiment is made of MgO, although other material, such as those listed for the tunnel layer of FIG. 2, may be employed.

The layer 1134 is shown to be multi-layered. In an exemplary embodiment, the layer 1134 is formed of a CoFeB—Y layer 1118, which is shown formed on top of the layer 1116 and on top of the layer 1118 is shown formed a granular magnetic layer 1120 and top of the layer 1120 is shown formed a yet another granular magnetic layer 1121. The layers 1118, 1120 and 1121 comprise the layer 1134. The element X for layer 1110 can be chosen from one or more of: molybdenum, Mo, tantalum, Ta, titanium, Ti, silicon, Si, boron, B, and phosphorus, P. The element Y for layers 1112 and 1118 can be same as element X but the atomic percent is typically kept below 15 atomic percent. The typical thickness of layer 1106 is greater than 10 nm, layer 1108 layer is greater than 5 nm. In one exemplary embodiment, the layer 1106 is 20 nm thick and the layer 1130 has two parts, one adjacent to layer 1106 is deposited at a lower argon pressure of 2 mtorr and is 6 nm thick, and another layer deposited right on top of 8 nm thickness and deposited at a higher argon pressure of 10 mtorr. The typical thickness of the layers of the fixed layer 1132, layer 1110 is typically greater than 10 nm, the layer 1112 is 2-10 nm and layer 1114 is 1-3 nm thick. In one exemplary embodiment, the layer 1110 is 20 nm thick, layer 1112 is 2 nm thick and layer 114 is 3 nm thick.

In FIG. 11, the layers 1114, 1116 and 1118 are substantially amorphous when deposited or formed on top of the layer below them. After an annealing process, which is performed after all of the layers of the memory element 1100 are deposited, the foregoing layers are modified to create a spin filter to allow spin up or spin down to go through the adjacent layers. In FIG. 11, the layers 1118 and 1114 are made of the same material.

The layers 1110 and 1112, in an exemplary embodiment, are thicker in size than 10 nm so that their orientation is substantially perpendicular and are maintained in the same state.

The layer 1116 is more cubic when deposited. After annealing because, for example, MgO transforms more cubic (or 001) and transforms the layers 1114 and 1118 into cubic cobolt. The layer 1130 is atomically well matched to allow growth of the layer 1132.

The layers of the memory element 1100 are deposited sequentially in high-vacuum cluster tool system to ensure excellent epitaxial growth. The layer 1104 is typically a magnetic or a nonmagnetic alloy. Layer 1104 and the bottom electrode 1102 may be grown on additional metallic layers which are grown directly over the wafer (a wafer includes many memory elements formed thereon) which includes a CMOS transistor and metallic contacts.

It is essential that there is an excellent electrical contact made with the "contact". In an exemplary embodiment, the layer 1106 is typically Ti with a thickness of 20-100 nm. Additional choices of material for the layer 1106 are TiTa, TiW. The layer 1108 is made primarily of Ru to ensure proper epitaxial growth of layer 1110. Advantageously, the layer 1108 is grown in two steps with the fist layer adjacent to the layer 1106 being grown under a lower argon pressure (such as below 10 millitorr (mtorr), preferably around 1 mtorr) and the surface closer to the layer 1110 side is grown at a much higher argon pressure (such as over 10 mtorr, preferably around 15-20 mtorr). This creates a unique surface to facilitate columnar growth of the subsequent magnetic layer 1110. Layer 1110 comprises of CoCrPt—X where X is chosen from $TiO_2$, $SiO_2$, $Al_2O_3$, $Ta_2O_5$, $ZrO_2$. The preferred alloy for layer 1110 is CoCr(6-15 at %)Pt(<12 at %)-(2-20 mol %)$TiO_2$. Other preferred alloy for layer 1110 is CoCr(6-15 at %)Pt(<12 at %)-(2-mol %)$SiO_2$.

The selected oxides have high level of immiscibility in the base alloy thereby resulting in nice cylindrical columns. These columns have two effects, namely they increase the local magnetic field to assist switching of the free-layers 1118, 1120 and 1121. The local magnetic field is inversely proportional to radius of the column. Additionally, these channels act as channels for enhancing the local current density for the spin-polarized current. One hypothesis is that these channels act as current-concentrator for the spin polarized spins which travel through the subsequent layers and create sites to initiate spin-switching in the free-layers 1118, 1120 and 1121. The net result is that the switching in the free-layer initiates at multiple locations and thereby leading to a lower switching current through accelerated avalanche switching. Layer 1110 has a typical thickness of about 20-30 nm in order to ensure perpendicular anisotropy of the magnetic moments whereby the magnetic moments in that layer stay normal to the film plane, as indicated through the arrows in layer 1110 in FIG. 11. Layer 1112 having a typical layer of 1-5 nm and having a composition of CoCr(<12 at %)Pt(<12 at %)B(<12 at %) is deposited directly on top of the layer 1110. The magnetic moment of the layer 1112 is expected to be substantially perpendicular. Layer 1114 is 1-5 nm thick, preferably 2-3 nm and is made of CoFe(40-60 at %)B(10-20 at %) which is largely amorphous in the as-deposited state. Layer 1116 is 0.8-2 nm thick and is made of MgOx (x=0.9-1.1). Layer 1118 is same as layer 1114 and is 1-2 nm thick.

The deposition process and the design of layers 1114, 1116 and 1118 are very important for building a high performance memory. Layer 1120 is designed to get low program(switching current). The dark areas in layer 1120 corresponds to the "oxide" of the starting material which are typically CoFe(0-100%)-$TiO_2$ which are deposited by sputtering (rf or dc-magnetron) through a composite target consisting of magnetic alloy and the oxide. The magnetic grains and the oxide zone separate during the process of deposition, primarily because they are largely immiscible. Typically a larger proportion of oxide such as over 10 mol % is used to get well separated and smaller grains of magnetic which act as an initiator of magnetization switching in the layer 1121. Layer 1121 is typically 2-5 nm thick and is made of CoCrPtB having substantially normal magnetic moment. As shown in FIG. 11 the moment of this layer stays in two directions: up or down. Layers 1118, 1120, 1121 are called the free-layer, as compared to layers 1114, 1112 and 1110 which are collectively referred to as the fixed-layer. Layer 1122 is the cap layer which is deposited directly on top of the layer 1121, and is typically about 50 to 100 nm thick and is made of Ta. Other materials can be Ti, W, TiW. The choice of the material, its process and thickness may depend on the choice of the reactive etch process which is used to etch the magnetic films following different photo-mask steps to get the right dimension of the memory element.

One of the key processes is the magnetic annealing process where the magnetic films are exposed to a magnetic field of 4-10 KOe applied normal to the wafer surface at a temperature of typically over 350 C. In one embodiment, a magnetic field of 5 KOe is applied normal to the wafer surface at a temperature of 375 C for 2 hours. The role of the application of the magnetic field is to set the magnetic-orientation of the fixed-layers. The field exposure time does not have to be as long and can be as short as few minutes. The net effect of the temperature annealing is to cause recrystallization in the MgO of layer 1116 which causes recrystallization in the layers 1114 and 1118. This is a very critical step to ensure high TMR, tunneling magneto-resistance, which is related to the ratio of resistance of two states.

FIG. 7 shows a graph 702 of the thermal stability (shown on the y-axis) relative to the write-ability (shown on the x-axis). The thermal stability is effectively reliability and write-ability is the current for program and erase. The graph 702 represents the improvement of the thermal stability as well as the write-ability of memory made of the memory elements of the various embodiments of the present invention. As show by the line 700, the percentage of improvement is approximately over twenty percent.

FIG. 12 shows a memory architecture 1200 incorporating the memory elements of the various embodiments of the present invention. In particular, FIG. 12 shows a magnetic tunnel junction, such as the magnetic tunnel junction (MTJ) 1202 coupled to an access transistor 1204, in accordance with an embodiment of the present invention. In FIG. 12, the MTJ 1202 is shown coupled, through an electrode 1206, to a bit line 1208, on one of its ends. On the other end, the MTJ 1202 is shown coupled to a bottom electrode 1220 (BE), through a contact, which is also shown coupled to a drain gate of a transistor 1212. The transistor 1204 further includes a source shown coupled to the program/erase line 1210.

The gate 1214 of the transistor 1204 is shown coupled to a word line 1216. The embodiment of the FIG. 12 may be referred to as a single or 1-cell architecture. The MTJ also referred to as the memory element 100 acts as the non-volatile memory element. The MTJ element has low resistance in the programmed state and higher resistance in the erased state. For example, in one embodiment of the present invention, the resistance for the low state is at least half of that of the high state. Low and high refer to binary states of '1' and '0' or vice versa. MTJ element or the memory element 100 is shown to have one transistor in series with it for accessing the memory element. The bit line 1208 is made of metal and the word line 1216 is made of poly-silicon.

In operation, the MTJ 1202 is accessed in the following manner. The memory (or MTJ) element 100 in conjunction with the access transistor 1204 form a memory cell. To program the cell, the bit line 1208 is connected to some positive power supply while the Prog/Erase line 1210 grounded. By accessing this cell the word line 1216 is raised to some voltage. This turns the transistor 1204 on and current flows from bit line 1208 to Prog/erase line 1210. Electrons flow in the opposite direction, and go through the fixed layer of the memory element 100 (or MTJ 1202) before entering the free layers. This causes the magnetic orientation of the free layers to align with the fix layer and the resistance (R) of the memory element 100 dropped to the minimum. The erase operation on the other hand is performed by changing the direction of the bit line and the program/erase line. This time the Prog/erase line is biased positive while the bit line is grounded. The current will flow from Prog/erase line to bit line, or electrons flow from bit line to Prog/erase line. Since the free and fix layers are magnetically aligned (programmed state), then minority electrons are reflected from the fix layer back into the free layer. These electrons have a spin orientation which is the opposite of the fix layer. When they are injected into the free layer, they apply a moment on the magnetic elements of the free layer in the opposite direction. By pushing enough electrons through eventually the magnetic orientation of the free layers change in the anti-parallel direction, and the MTJ resistance maximizes.

In alternative embodiments, the granular layers, such as the layers 1120, 316 and 216, of the various embodiments disclosed herein may be a non-uniform switching layer, such as the non-uniform switching-initiator layer (NSL), such as those disclosed in U.S. patent application Ser. No. 11/674,124 and entitled "Non-uniform Switching Based Non-Volatile Magnetic Base Memory", referenced hereinabove, the disclosure of which is incorporated herein as though set forth in full.

In yet another embodiment of the present invention, the MTJs of the various embodiments disclosed herein may be stacked to form a multi-state current-switching magnetic memory element, such as those disclosed in U.S. patent application Ser. No. 11/678,515 and entitled "A High Capacity Low Cost Multi-State Magnetic Memory", referenced hereinabove, the disclosure of which is incorporated herein, as though set forth in full.

It should be noted that the objects of the drawings or figures discussed and presented herein are not necessarily drawn to scale.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic memory element comprising:
a bottom electrode;
a pinning layer formed on top of and directly contacting the bottom electrode;
a fixed layer formed on top of and directly contacting the pinning layer;
a tunnel layer formed on top of and directly contacting the fixed layer;
a first free layer formed on top of and directly contacting the tunnel layer;
a granular film layer formed on top of and directly contacting the first free layer, the granular film layer being made of a base magnetic alloy having a compound and having a granular micro-structure with grains that, prior to the application of current to the magnetic memory element, have random magnetic moments associated therewith and are separated from each other by grain boundaries, the granular film layer being made of $(CO_xFe_{(1-x)})(Z)$, wherein x is the atomic percent and is a value in the range of greater than 0 to 1 where 1 refers to 100 atomic percent and wherein Z is a compound chosen from any of the following list of compounds and can be a mixture of: Titatnium oxide ($TiO_2$), tantalum oxide ($Ta_2O_5$), tungsten oxide (WO), tantalum nitride (TaN), or titanium nitride (TiN);
a second free layer formed on top of and directly contacting the granular film layer and having grains, the second free layer having a magnetic orientation associated therewith, the magnetic orientation of the second free layer switching when current is applied to the magnetic memory element, such that during the switching process, it is not until a substantial number of magnetic grains of the second free layer have switched that these grains couple together and build a critical volume to cause an avalanche type switching of the rest of the grains of the second free layer and once the grains of the second free layer have switched they are magnetostatically coupled together with the neighboring grains;

a cap layer formed on top of the second free layer; and
a top electrode formed on top of the cap layer, wherein the first free layer has grains, the grains of the first free layer being magnetically more exchange coupled than that of the second free layer.

2. A magnetic memory element, as recited in claim 1, wherein the first and second free layers are made of different material.

3. A magnetic memory element, as recited in claim 1, wherein the top electrode and the bottom electrode are each made of Tantalum (Ta).

4. A magnetic memory element, as recited in claim 1, wherein the tunnel layer is made of material selected from a group consisting of: $TiO_2$, $Al_2O_3$, MgO, $Ta_2O_5$, $HfO_2$, $ZrO_2$, TaN, SrO and RuO.

5. A magnetic memory element, as recited in claim 1, wherein the cap layer is substantially made of a cubic crystal structure.

6. A magnetic memory element, as recited in claim 1, wherein the cap layer is made substantially of one or more of the following layers: RuCr, NiAl, NiRu, NiAlRu, NiZr, Cu/Ru, or Au/Ru.

7. A magnetic memory element, as recited in claim 1, wherein the fixed layer and the first layer are substantially amorphous.

8. A magnetic memory element, as recited in claim 1, wherein the fixed layer, tunnel layer and the second free layer is substantially nano-crystalline following deposition.

9. A magnetic memory element, as recited in claim 1, wherein the tunnel layer is made of magnesium oxide (MgO).

10. A magnetic memory element, as recited in claim 1, wherein the tunnel layer has a thickness between the range of 0.8 to 3 nano meters (nm).

11. A non-volatile current-switching magnetic memory element, as recited in claim 1, wherein the fixed layer is multi-layered.

12. A non-volatile current-switching magnetic memory element, as recited in claim 11, wherein the muti-layers of the fixed layer are made of Cobalt-Iron(CoFe)/Ruthenium(Ru)/Cobalt-Iron-Boron(CoFeB) wherein the CoFe layer is formed adjacent to or on top of the pinning layer and the CoFeB layer is formed adjacent to or below the tunnel layer so that between the pinning layer and the tunnel layer are CoFe on top of which is formed Ru on top of which is formed CoFeB.

13. A method of manufacturing a non-volatile current-switching magnetic memory element comprising:
    forming a bottom electrode;
    forming a pinning layer on top of and directly contacting the bottom electrode;
    forming a fixed layer on top of and directly contacting the pinning layer;
    forming a tunnel layer on top of and directly contacting the fixed layer;
    forming a first free layer on top of and directly contacting the tunnel layer;
    forming a granular film layer formed on top of and directly contacting the first free layer, the granular film layer being a base magnetic alloy having a compound and having a granular micro-structure with grains that, during deposition, couple together to form the center of the grains which are isolated from each other by the compound, the granular film layer being made of $(CO_xFe_{(1-x)})(Z)$, wherein x is the atomic percent and is a value in the range of greater than 0 to 1 where 1 refers to 100 atomic percent and wherein Z is a compound chosen from any of the following list of compounds and can be a mixture of: Titatnium oxide ($TiO_2$), tantalum oxide ($Ta_2O_5$), tungsten oxide (WO), tantalum nitride (TaN), or titanium nitride (TiN);
    forming a second free layer formed on top of and directly contacting the granular film layer, the second free layer having grains, the second free layer having a magnetic orientation associated therewith, the magnetic orientation of the second free layer switching when current is applied to the magnetic memory element, such that during the switching process, it is not until a substantial number of magnetic grains of the second free layer have switched that these grains couple together and build a critical volume to cause an avalanche type switching of the rest of the grains of the second free layer and once the grains of the second free layer have switched they are magnetostatically coupled together with the neighboring grains;
    forming a cap layer formed on top of and directly contacting the second free layer; and
    forming a top electrode formed on top of and directly contacting the cap layer, wherein the first free layer has grains, the grains of the first free layer being magnetically more exchange coupled than that of the second free layer.

14. A magnetic memory element, as recited in claim 1, wherein the cap layer is made substantially of one or more of the following layers: RuCr, NiAl, NiRu, NiAlRu, NiZr, or Cu/Ru.

15. A magnetic memory element, as recited in claim 1, wherein the second free layer is made of magnetic material whose grains are weakly exchange coupled.

16. A magnetic memory element, as recited in claim 1, wherein the second free layer is made of an alloy having one or more of the ferromagnetic elements: Co, Fe and Ni.

17. A magnetic memory element, as recited in claim 1, wherein the second free layer contains less than 20 but greater than 0 atomic percent of platinum.

18. A magnetic memory element, as recited in claim 1, wherein the second free layer contains greater than 0 and up to 20 atomic percent of one or more of the following elements: phosphorous (P), boron(B), chromium(Cr), tantalum (Ta), tungsten(W), or molybdenum(Mo).

* * * * *